(12) United States Patent
Isobayashi

(10) Patent No.: US 8,134,234 B2
(45) Date of Patent: Mar. 13, 2012

(54) APPLICATION OF MN FOR DAMAGE RESTORATION AFTER ETCHBACK

(75) Inventor: Atsunobu Isobayashi, Clifton Park, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 12/486,900

(22) Filed: Jun. 18, 2009

(65) Prior Publication Data

US 2010/0320604 A1    Dec. 23, 2010

(51) Int. Cl.
*H01L 23/52* (2006.01)
*H01L 23/48* (2006.01)
*H01L 29/40* (2006.01)
*H01L 21/768* (2006.01)
*H01L 21/4763* (2006.01)

(52) U.S. Cl. ............... 257/751; 257/774; 257/E21.584; 257/E21.585; 438/618; 438/620; 438/627

(58) Field of Classification Search .................. 257/751, 257/774, E21.584, E21.585; 438/618, 620, 438/627
See application file for complete search history.

(56) References Cited

U.S. PATENT DOCUMENTS

| | | | |
|---|---|---|---|
| 6,407,453 B1 * | 6/2002 | Watanabe et al. | 257/758 |
| 6,429,120 B1 * | 8/2002 | Ahn et al. | 438/635 |
| 6,566,242 B1 * | 5/2003 | Adams et al. | 438/622 |
| 6,737,747 B2 * | 5/2004 | Barth et al. | 257/760 |
| 6,873,057 B2 * | 3/2005 | Chen et al. | 257/777 |
| 7,300,866 B2 * | 11/2007 | Hong | 438/637 |
| 7,304,384 B2 | 12/2007 | Kaike et al. | |
| 2009/0212439 A1 * | 8/2009 | Farooq et al. | 257/773 |

OTHER PUBLICATIONS

M. Haneda, et al., "Self-Restored Barrier using Cu-Mn alloy", Conference Proceedings of Advanced Metalization Conference (AMC 2007), pp. 59-65.

* cited by examiner

*Primary Examiner* — Luan C Thai
(74) *Attorney, Agent, or Firm* — Turocy & Watson, LLP

(57) ABSTRACT

Back end of line interconnect structures and methods of making a back end of line interconnect structure are provided. The back end of line interconnect structure contains a first interconnect layer containing a first conductive feature and a first dielectric layer; a first cap layer over the first interconnect layer, and a second interconnect layer over the first cap layer. The second interconnect layer contains a second conductive feature, a second dielectric layer, and two or more barrier layers therebetween. The two or more barrier layers contain a first barrier layer over the second dielectric layer and a $MnO_x$-containing barrier layer over the first barrier layer. Containing the $MnO_x$-containing barrier layer, the back end of line interconnect structure can prevent and/or mitigate diffusion of conductive material of the second conductive feature therethrough.

29 Claims, 12 Drawing Sheets

APPLICATION OF MN FOR DAMAGE RESTORATION AFTER ETCHBACK

TECHNICAL FIELD

The following description relates generally to back end of line interconnect structures and methods of making a back end of line interconnect structure.

BACKGROUND

Semiconductor processing involves a number of different chemical and physical steps whereby minute electronic devices are created on a substrate at the front end of a fabrication process. Integrated circuits are constructed using multilayers of interrelated patterns of various materials, the layers being created by such processes as chemical vapor deposition (CVD), physical vapor deposition (PVD), and epitaxial growth. Some layers are patterned using photoresist masks and followed by wet and dry etching techniques.

Patterns are created within layers by the implantation of dopants at particular locations. The substrate upon which the devices are created may be silicon, gallium arsenide, glass, or other appropriate material.

In the production of integrated circuits upon the substrate, back end of production involves connecting the fabricated semiconductor devices on the chip with electrically conductive materials. This back-end-of-line (BEOL) "wiring," which is the electrical connection scheme for connecting semiconductor devices, completes the circuits as designed to function within the total integrated circuit device. Metal lines are used in the metallization process as electrical connections between semiconductor devices.

Increased semiconductor device performance can be achieved, at least in part, through the further miniaturization of features such as transistors. Decreased feature sizes and decreased spacings between features allow more features to be placed in a unit area for greater device performance. As feature densities increase, the widths of the conductive lines and the spacings between the conductive lines also need to scale smaller.

SUMMARY

The following presents a simplified summary of the information disclosed in the specification in order to provide a basic understanding of some aspects of the disclosed information. This summary is not an extensive overview of the disclosed information, and is intended to neither identify key or critical elements of the disclosed information nor delineate the scope of the disclosed information. Its sole purpose is to present some concepts of the disclosed information in a simplified form as a prelude to the more detailed description that is presented later.

One aspect of the innovation provides back end of line interconnect structures. The back end of line interconnect structure contains a first interconnect layer containing a first conductive feature and a first dielectric layer; a first cap layer over the first interconnect layer, and a second interconnect layer over the first cap layer. The second interconnect layer contains a second dielectric layer and an opening therein containing a via and a trench.

The opening contains a second conductive feature and two or more barrier layers between the second dielectric layer and the second conductive feature. The two or more barrier layers contain a first barrier layer over the second dielectric layer in the opening and a $MnO_x$-containing barrier layer over the first barrier layer. Containing the $MnO_x$-containing barrier layer, the back end of line interconnect structure can prevent and/or mitigate diffusion of conductive material of the second conductive feature therethrough.

Another aspect of the innovation relates to methods of making a back end of line interconnect structure. In the methods, a first interconnect layer, a first cap layer over the first interconnect layer, and a second interconnect layer over the first cap layer are provided. The first interconnect layer contains a first conductive feature and a first dielectric layer. The second interconnect layer contains a second dielectric layer and an opening containing a via and a trench. The via extending through the first cap layer to the upper surface of the first conductive feature.

One aspect of the methods can involve forming a first barrier layer over the sidewalls and bottom surface of the opening; removing a portion of the first barrier layer at the bottom of the via and exposing an upper portion of the first conductive feature in the via; forming a Mn-containing barrier layer over the first barrier layer over the sidewalls and bottom surface of the opening; forming a seed layer over the Mn-containing barrier layer; forming a second conductive material in the opening over the seed layer by electrical plating; and annealing the Mn-containing barrier layer to form manganese oxides in the Mn-containing barrier layer.

Another aspect of the methods can involve forming a first barrier layer over the sidewalls and bottom surface of the opening; removing a portion of the first barrier layer at the bottom of the via and exposing an upper portion of the first conductive feature in the via; forming a Mn-containing barrier layer over the first barrier layer over the sidewalls and bottom surface of the opening, the Mn-containing barrier layer containing manganese and a seed metal; forming a second conductive material in the opening over the Mn-containing barrier layer by electrical plating; and annealing the Mn-containing barrier layer to form manganese oxides in the Mn-containing barrier layer.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the disclosed information when considered in conjunction with the drawings.

DETAILED DESCRIPTION

Figure 1:
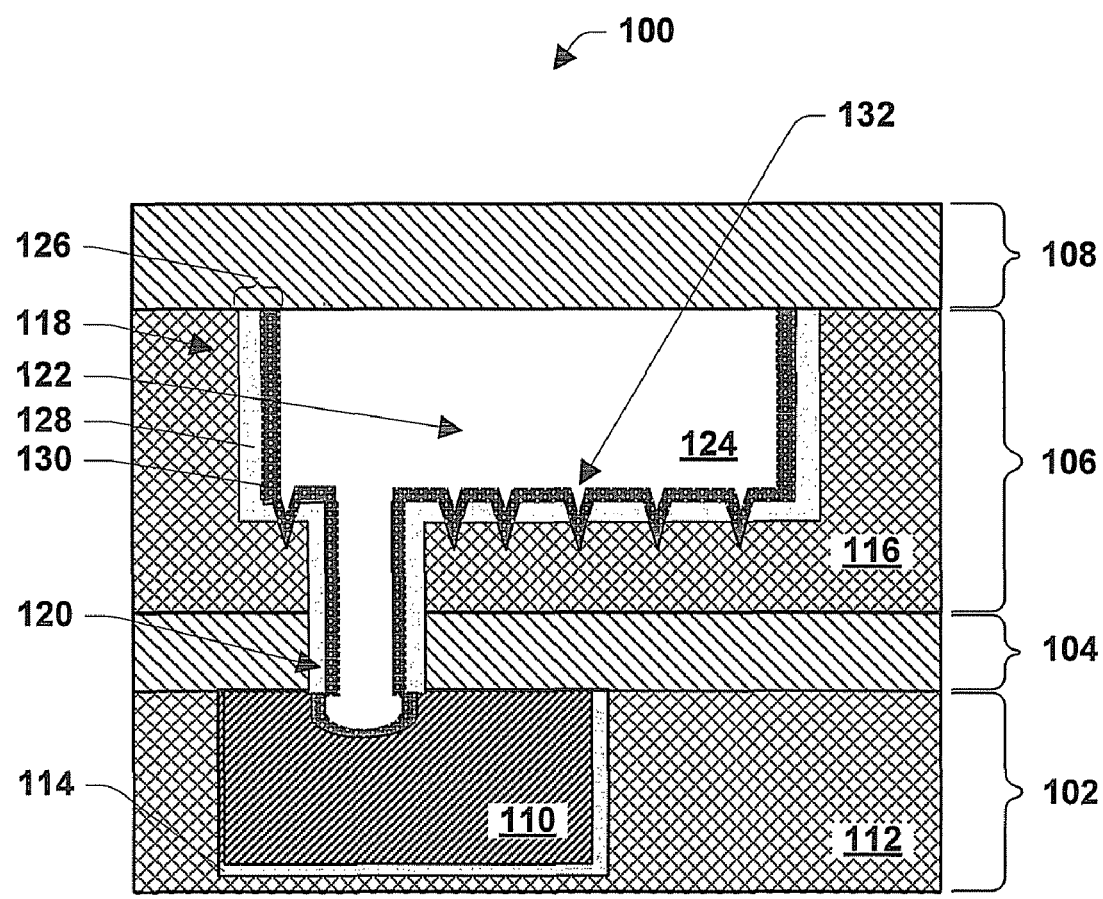
FIG. 1 is a cross-sectional illustration of exemplary back end of line interconnect structure in accordance with an aspect of the subject innovation.

A back end of line interconnect structure generally contains a barrier layer to separate a conductive feature from a dielectric layer. When the fabrication process of the back end of line interconnect structure employs an etchback process, the etchback process may cause damages to the barrier layer and decrease barrier layer properties. When the dielectric layer contains porous ultra-low k dielectric materials, the etchback may cause much damage to the dielectric layer. Such damages may result in a rough surface and/or discontinuities of the barrier layer and/or the dielectric layer. Because of the rough surface and/or discontinuities, the barrier layer exhibits poor coverage.

The subject innovation described herein provides back end of line interconnect structures and methods of making a back end of line interconnect structure. The back end of line interconnect structure contains a first interconnect layer containing a first conductive feature and a first dielectric layer; a first cap layer over the first interconnect layer, and a second interconnect layer over the first cap layer. The second interconnect layer contains a second dielectric layer and an opening therein containing a via and a trench.

In the opening, the back end of line interconnect structure contains a second conductive feature and two or more barrier layers between the second conductive feature and the second dielectric layer. The two or more barrier layers contain a first barrier layer over the second dielectric layer in the opening and a $MnO_x$-containing barrier layer over the first barrier layer. Containing the $MnO_x$-containing barrier layer, the back end of line interconnect structure can prevent and/or mitigate diffusion of conductive material of the second conductive feature therethrough.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

FIG. 1 illustrates a cross sectional view of an exemplary back end of line interconnect structure 100. The back end of line interconnect structure contains a first interconnect layer 102; a first cap layer 104 over the first interconnect layer, a second interconnect layer 106 over the first cap layer. The back end of line interconnect structure can contain a third dielectric layer 108 over the second interconnect layer.

The first interconnect layer 102 contains a first conductive feature 110 and a first dielectric layer 112. The first conductive feature includes any suitable conductive material. Examples of conductive materials include polysilicon, a conductive metal (e.g., Cu, Al, W), an alloy containing at least one conductive metal (e.g., Al with Cu or a Cu alloy), a conductive metal silicide or combinations thereof. The first conductive feature can have an upper surface that is substantially coplanar with an upper surface of the first dielectric layer.

The first conductive feature 110 can be separated from first dielectric layer 112 by a barrier layer 114 of the first interconnect layer. The barrier layer can contain tantalum (Ta), tantalum nitride (TaN), titanium (Ti), titanium nitride (TiN), ruthenium (Ru), ruthenium nitride (RuN), tungsten (W), tungsten nitride (WN) or any other material that can serve as a barrier to prevent conductive material from diffusing therethrough. The barrier layer can have a thickness of about 1 nm or more and about 50 nm or less. In another embodiment, the barrier layer has a thickness of about 5 nm or more and about 40 nm or less. In one embodiment, the first interconnect layer 102 does not contain a barrier layer between the first conductive feature and the first dielectric layer.

The first dielectric layer 112 can contain any suitable interlevel or intralevel dielectric including inorganic dielectrics or organic dielectrics. The dielectric material can be porous or non-porous. The first dielectric layer contains one or more dielectric layers. When the first dielectric layer contains two or more dielectric layers, the layers can be the same or different from each other. Examples of dielectric materials include silicon containing materials such as FSG (fluorinated silicon oxide (SiOF)), SiCOH (e.g., a carbon doped oxide material including elements of Si, C, H and O), HSQ (hydrogen silsesquioxane polymer), MSQ (methyl silsesquioxane polymer), OSG (organosilicate glass), and highly porous $SiO_2$, or organics such as parylene, BCB, polyphenylene oligomer, fluorocarbons, and combinations thereof.

The first dielectric layer 112 can have any suitable thickness that depends on the desired implementations of the back end of line interconnect structure. In one embodiment, the first dielectric layer has a thickness of about 10 nm or more and about 1,000 nm or less. In another embodiment, the first dielectric layer has a thickness of about 10 nm or more and about 800 nm or less. In yet another embodiment, the first dielectric layer has a thickness of about 10 nm or more and about 500 nm or less.

The first dielectric layer 112 can have a low dielectric constant ("low-k"). The first dielectric layer has a dielectric constant less than that of $SiO_2$. In one embodiment, the first dielectric layer has a dielectric constant less than about 3.0. In another embodiment, the first dielectric layer has a dielectric constant less than about 2.6. In yet another embodiment, the first dielectric layer has a dielectric constant less than about 2.3.

The first cap layer 104 can contain any suitable dielectric capping material. Examples of dielectric capping materials include silicon carbide (SiC), silicon nitride (SiN), silicon carbon nitride (SiCN), tetrasilicon ammonia ($Si_4NH_3$), silicon oxide ($SiO_2$), a carbon doped oxide, a nitrogen and hydrogen doped silicon carbide SiC(N,H) or multiple layers thereof. The first cap layer has a thickness of about 10 nm or more and about 50 nm or less.

The second interconnect layer 106 contains a second dielectric layer 116 and an opening 118 in the second dielectric layer. The opening contains a via 120 and a trench 122. The via extends through the first cap layer to the first interconnect layer. A portion of the second conductive feature (e.g., a bottom portion) extends through the first cap layer to the upper surface of the first conductive layer. The second conductive feature can be electrically connected to the first conductive feature by the via. The second conductive feature can have an upper surface that is substantially coplanar with an upper surface of the second dielectric layer.

The opening 118 contains a second conductive feature 124 and two or more barrier layers 126 between the second conductive feature and the second dielectric layer. The two or more barrier layers contain a first barrier layer 128 over the second dielectric layer in the opening and a $MnO_x$-containing barrier layer 130 over the first barrier layer. The first barrier layer can be formed over the sidewalls and bottom surface of the opening, and then the $MnO_x$-containing barrier layer can be formed over the first barrier layer. The first barrier layer can contain one, two, or more barrier layers. The second conductive feature is separated from the second dielectric layer by the two or more barrier layers 126.

The second conductive feature 124 can contain any suitable conductive material. For example, the second conductive feature contains any conductive material of the first conductive feature as described above.

The second dielectric layer 116 can contain any suitable interlevel or intralevel dielectric including inorganic dielectrics or organic dielectrics. The dielectric material can be porous or non-porous. The second dielectric layer contains one or more dielectric layers. When the second dielectric layer contains two or more dielectric layers, the layers can be the same or different from each other. The second dielectric layer 116 can contain any dielectric material of the first dielectric layer 112 as described above. For example, the second dielectric layer contains porous SiCOH.

The second dielectric layer 116 can have any suitable thickness that depends on the desired implementations of the back end of line interconnect structure. In one embodiment, the second dielectric layer has a thickness of about 10 nm or more and about 2,000 nm or less. In another embodiment, the second dielectric layer has a thickness of about 10 nm or more and about 1,500 nm or less. In yet another embodiment, the second dielectric layer has a thickness of about 10 nm or more and about 1,000 nm or less.

The second dielectric layer 116 can have a low dielectric constant ("low-k"). The second dielectric layer has a dielectric constant less than that of $SiO_2$. In one embodiment, the second dielectric layer has a dielectric constant less than about 3.0. In another embodiment, the second dielectric layer has a dielectric constant less than about 2.6. In yet another embodiment, the second dielectric layer has a dielectric constant less than about 2.3.

The first barrier layer 128 of the second interconnect layer 106 can contain any material that can serve as a barrier to prevent and/or mitigate diffusion of conductive material of the second conductive feature therethrough. The first barrier layer can contain any barrier material of the barrier layer of the first interconnect layer as described above. For example, the first barrier layer contains tantalum (Ta), tantalum nitride (TaN), titanium (Ti), or titanium nitride (TiN). In one embodiment, the first barrier layer of the second interconnect layer contains one or more barrier layers. For example, two layers of the first barrier layer contain tantalum nitride.

The $MnO_x$-containing barrier layer 130 of the second interconnect layer contains manganese oxides ($MnO_x$, where x is about 1 or more and about 2 or less) such as MnO, $MnO_2$, $Mn_2O_3$, and $Mn_3O_4$. Containing the manganese oxide, the $MnO_x$-containing barrier layer can provide a high barrier property and prevent and/or mitigate diffusion of conductive material of the second conductive feature therethrough. As a result, the $MnO_x$-containing barrier layer can prevent and/or mitigate a current leakage, thereby improving TDDB (time dependent dielectric behavior).

In one embodiment, the first barrier layer 128 has discontinuities 132 over the bottom surface of the trench and the $MnO_x$-containing barrier layer covers the discontinuities. Portions of the $MnO_x$-containing barrier layer contact the second dielectric layer through the discontinuities of the first barrier layer. The manganese oxides of the $MnO_x$-containing barrier layer can be made by oxidizing manganese with oxygen from the second dielectric layer.

The $MnO_x$-containing barrier layer 130 can further contain tantalum (Ta), titanium (Ti), copper (Cu), aluminum (Al), cobalt (Co), or combinations thereof. In one embodiment, the $MnO_x$-containing barrier layer contains a manganese oxide and one metal selected from the group consisting of tantalum (Ta), titanium (Ti), copper (Cu), aluminum (Al), and cobalt (Co). In another embodiment, the $MnO_x$-containing barrier layer contains a manganese oxide and two metals selected from the group consisting of tantalum (Ta), titanium (Ti), copper (Cu), aluminum (Al), and cobalt (Co).

The $MnO_x$-containing barrier layer 130 contains any suitable amount of manganese oxide as long as the amount can improve the TDDB. In one embodiment, some portions or substantially entire portion of the $MnO_x$-containing barrier layer 130 are combined with portions of first barrier layer 128. In another embodiment, when the $MnO_x$-containing barrier layer contains a compound other than a manganese oxide, the $MnO_x$-containing barrier layer contains about 1 wt. % or more of manganese oxide and about 70 wt. % or less of manganese oxide. In another embodiment, the $MnO_x$-containing barrier layer contains about 1 wt. % or more of manganese oxide and about 60 wt. % or less of manganese oxide. In yet another embodiment, the $MnO_x$-containing barrier layer contains about 1 wt. % or more of manganese oxide and about 50 wt. % or less of manganese oxide.

The first and $MnO_x$-containing barrier layers 126 can have any suitable thickness that depends on the desired implementations of the back end of line interconnect structure. In one embodiment, the first and $MnO_x$-containing barrier layers independently have a thickness of about 1 nm or more and about 50 nm or less. In another embodiment, the first and $MnO_x$-containing barrier layers independently have a thickness of about 3 nm or more and about 40 nm or less. In yet another embodiment, the first and $MnO_x$-containing barrier layers independently have a thickness of about 5 nm or more and about 30 nm or less.

The back end of line interconnect structure can contain a second cap layer 108 over the second interconnect layer 106. The second cap layer can contain any suitable dielectric capping material. For example, the second cap layer contains any material of the first cap layer material as described above.

Figure 2:
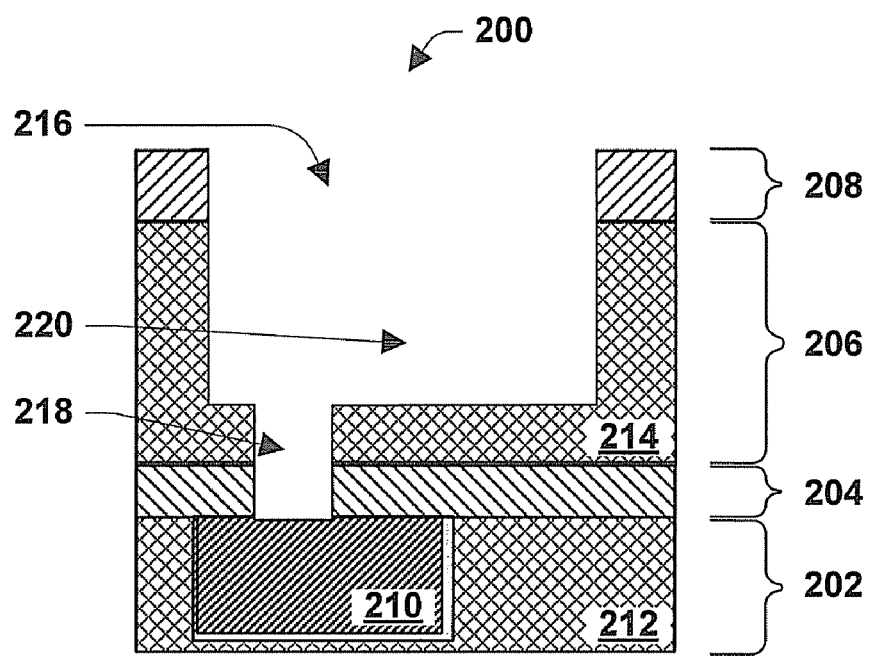
FIGS. 2-9 illustrate an exemplary methodology of forming a back end of line interconnect structure in accordance with an aspect of the subject innovation.

Referring to FIGS. 2 to 16, three of many possible exemplary embodiments of forming a back end of line interconnect structure are specifically illustrated. FIG. 2 illustrates a cross sectional view of an intermediate state of an exemplary back end of line interconnect structure 200 after dual damascene patterning. The back end of line interconnect structure can contain a first interconnect layer 202, a first cap layer 204 over the first interconnect layer, and a second interconnect layer 206 over the first cap layer. The intermediate state of back end of line interconnect structure can contain a third dielectric layer 208 over the second interconnect layer.

The first interconnect layer contains a first conductive feature 210 and a first dielectric layer 212 in the same manner as described in connection with FIG. 1. The first cap layer 204 contains any suitable dielectric capping material. The second interconnect layer 206 contains a second dielectric layer 214. The second dielectric layer contains any dielectric material of the first dielectric layer as described above in connection with FIG. 1.

The third dielectric layer 208 can contain any suitable dielectric material such as silicon oxides. The third dielectric layer contains one or more dielectric layers. For example, the third dielectric layer contains two or more layers; one contains silicon oxides and another contains SiCOH.

The third dielectric layer 208 can have a higher dielectric constant than that of the second dielectric layer. In one embodiment, the third dielectric layer has a dielectric constant more than about 2.6. In another embodiment, the third dielectric layer has a dielectric constant more than about 3.0. In yet another embodiment, the third dielectric layer has a dielectric constant more than about 2.3.

The second interconnect layer 206 and the third dielectric layer 208 have an opening 216 including a via 218 and a trench 220. An upper portion of the first conductive feature 210 is exposed at the bottom of the via. The opening can be formed by dual damascene patterning. The details of the dual damascene structure and details of the dual damascene process are not critical to the subject innovation. The details of the structure and manufacture of the dual damascene structure can be found in, for example, commonly-assigned U.S. Pat. Nos. 6,433,428 and 6,407,453, which are hereby incorporated by reference.

Figure 3:
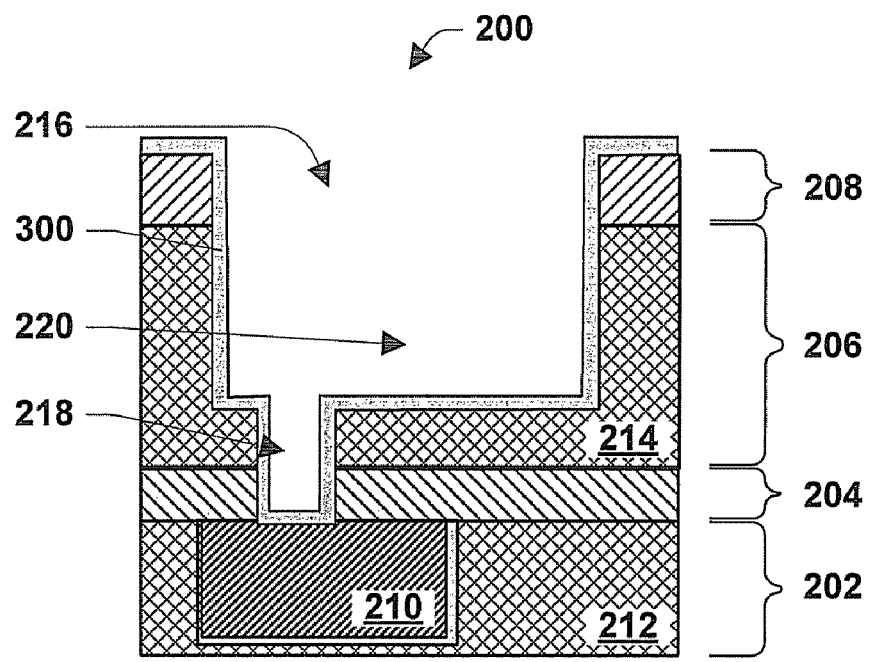

FIG. 3 illustrates forming a first barrier layer 300 over the sidewalls and bottom surface of the opening 216. The first barrier layer can contain any barrier material of the first barrier layer as described above in connection with FIG. 1. For example, the first barrier layer contains tantalum (Ta), tantalum nitride (TaN), titanium (Ti), or titanium nitride (TiN).

The first barrier layer 300 can be formed by any suitable technique. Examples of such techniques include physical vapor deposition (PVD), ionized plasma vapor deposition (IPVD), self-ionized plasma (SIP), atomic layer deposition (ALD), supercritical $CO_2$ ($SCCO_2$) deposition, chemical vapor deposition (CVD), metal organic chemical vapor deposition (MOCVD), plasma-enhanced chemical vapor deposition (PECVD), plasma-enhanced atomic layer deposition (PEALD), or the like.

Figure 4:
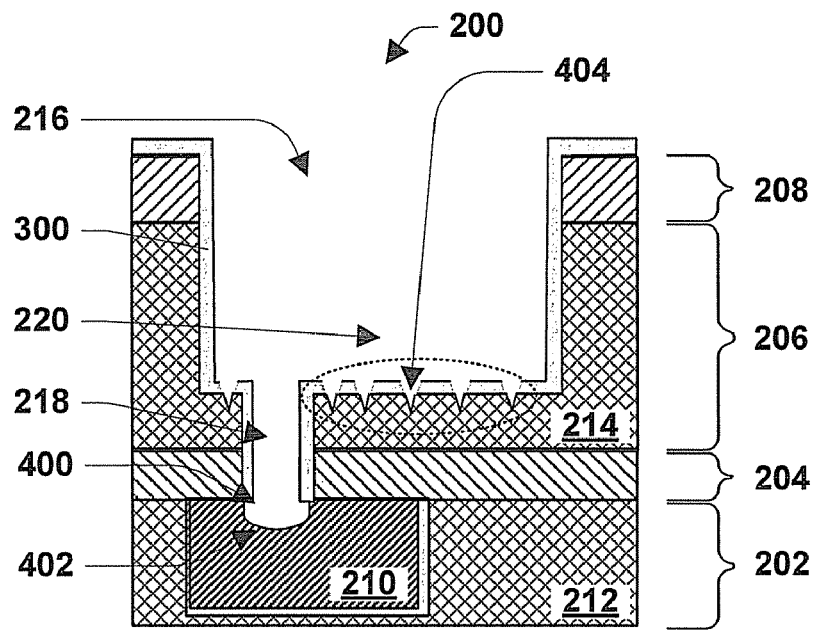

FIG. 4 illustrates removing a portion 400 of the first barrier layer of the second interconnect layer at the bottom of the via and exposing an upper portion 402 of the first conductive feature in the via. The portion of the first barrier layer can be removed by any suitable technique such as etchback techniques including Argon sputtering.

The etchback process (e.g., Ar sputtering) may cause damage to the first barrier layer and/or the second dielectric layer of the second interconnect layer, and decrease barrier layer properties of the first barrier layer. In particular, the etchback process can cause damage to a portion of the first barrier layer over the bottom of the trench as indicated by a dashed line. When the second dielectric layer contains porous ultra-low k dielectric materials (e.g., dielectric materials having a dielectric constant, k, of about 2.8 or less), the etchback may cause much damage to the second dielectric layer. Such damage results in a rough surface and/or discontinuities 404 of the first barrier layer and/or the second dielectric layer. Because of the rough surface and/or discontinuities, the first barrier layer exhibits poor coverage. In other words, the first barrier layer fails to fully cover the underlying second dielectric layer, thereby causing poor dielectric breakdown strength and/or poor electromigration resistance.

Figure 5:
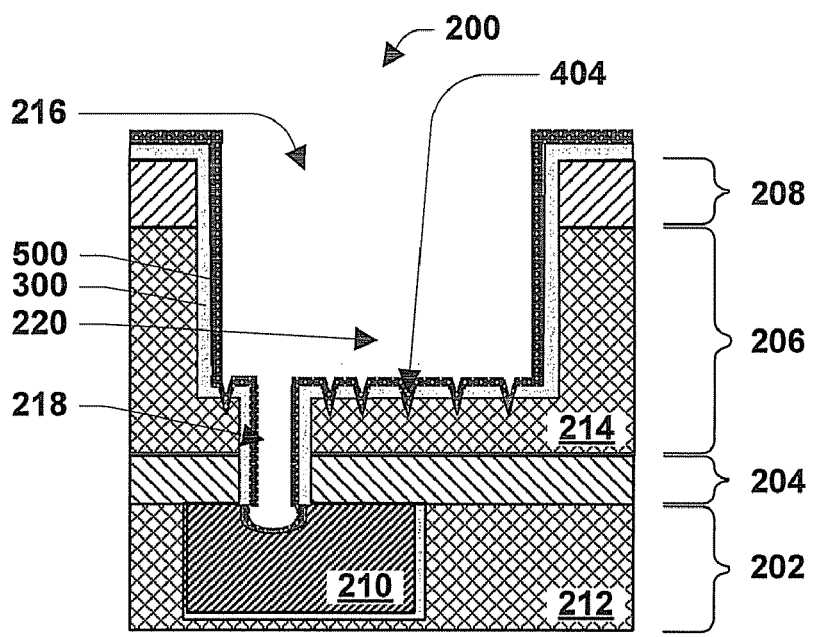

FIG. 5 illustrates forming a Mn-containing barrier layer 500 over the first barrier layer over the sidewalls and bottom surface of the opening. The Mn-containing barrier layer can contain Mn (e.g., substantially pure Mn) or Y—Mn alloy wherein Y is at least one selected from the group consisting of tantalum (Ta), titanium (Ti), aluminum (Al), and cobalt (Co). X does not substantially contain copper. Examples of Y—Mn alloys include TaMn, TiMn, AlMn, CoMn, TaTiMn, TaAlMn, TaCoMn, TiAlMn, TiCoMn, AlCoMn, or the like.

The Mn-containing barrier layer 500 can contain any suitable amount of manganese. In one embodiment, some portions or substantially entire portion of the Mn-containing barrier layer are combined with the first barrier layer. In another embodiment, the Mn-containing barrier layer contains about 1 wt. % or more of manganese and about 70 wt. % or less of manganese. In another embodiment, the Mn-containing barrier layer contains about 1 wt. % or more of manganese and about 60 wt. % or less of manganese. In yet another embodiment, the Mn-containing barrier layer contains about 1 wt. % or more of manganese and about 50 wt. % or less of manganese.

The Mn-containing barrier layer 500 is formed to cover the damages 404 of the first barrier layer and/or the second dielectric layer of the second interconnect layer. For example, the Mn-containing barrier layer is formed to cover the rough surface and/or discontinuities 404 of the first barrier layer and/or the second dielectric layer of the second interconnect layer. The Mn-containing barrier layer can be formed by any suitable technique such as PVD, IPVD, SIP, ALD, $SCCO_2$, CVD, MOCVD, PECVD, PEALD, or the like.

Figure 6:
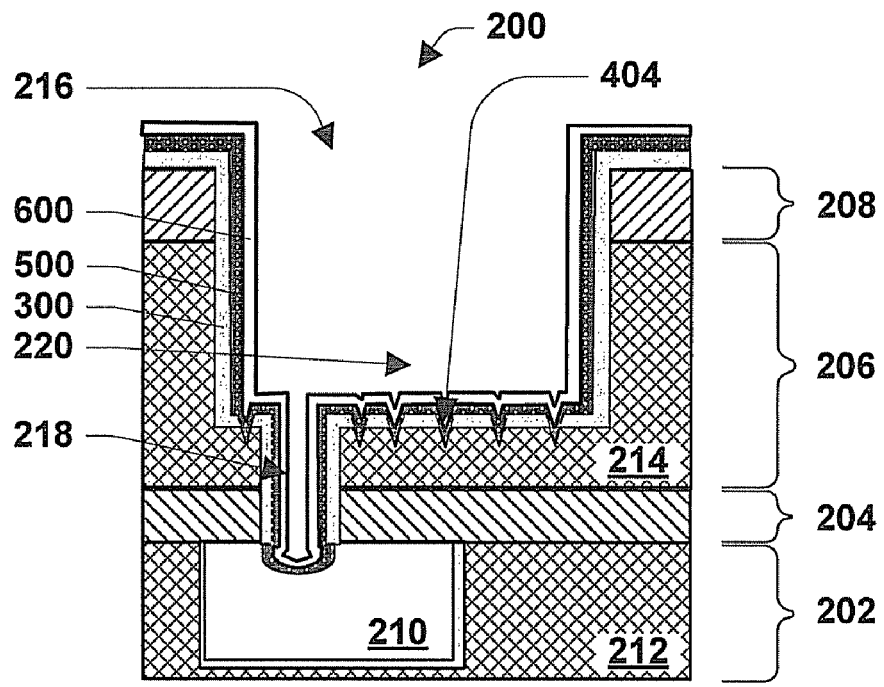

FIG. 6 illustrates forming a seed layer 600 over the Mn-containing barrier layer 500. The seed layer contains at least one metal that can provide sufficient field conductivity to enable electroplating of a second conductive feature in the opening in the subsequent process. In one embodiment, when a second conductive feature contains copper, the seed layer contains copper (Cu), or copper alloy (e.g., alloy of copper aluminum (CuAl)). The seed layer can be formed by any suitable technique such as PVD, IPVD, SIP, ALD, SCCO2, CVD, MOCVD, PECVD, PEALD, or the like. The seed layer can have any suitable thickness, for example, about 10 nm or more and about 100 nm or less.

Figure 7:
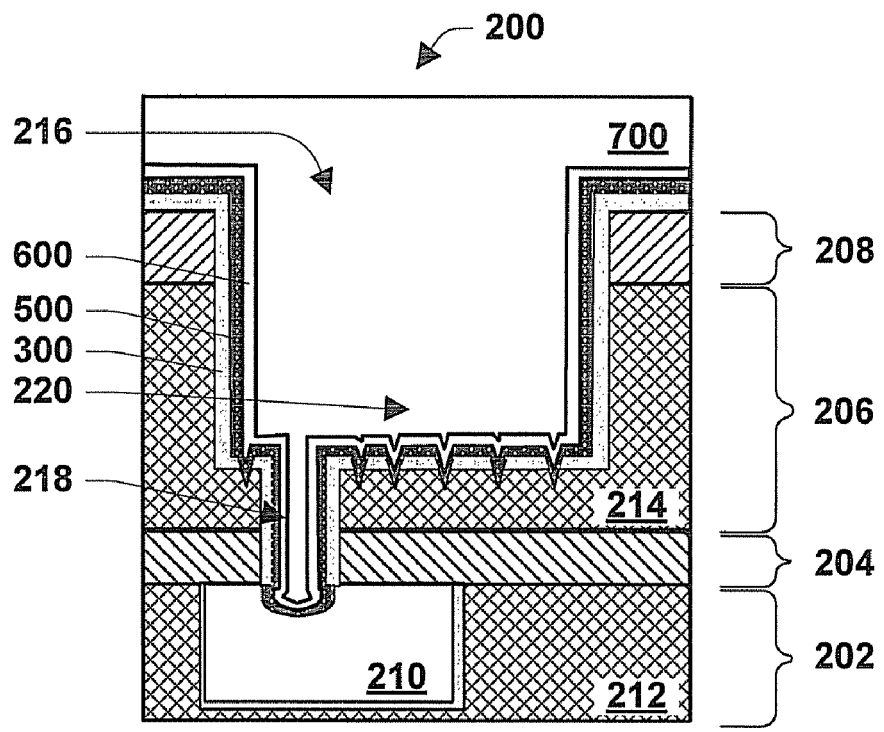

FIG. 7 illustrates forming a second conductive material 700 in the opening 216. A conductive material (e.g., copper (Cu) or an alloy of copper (Cu) and aluminum (Al)) can be formed in the opening by electrical plating. The thickness of second conductive material is about 300 nm or more and about 800 nm or less.

Figure 8A:
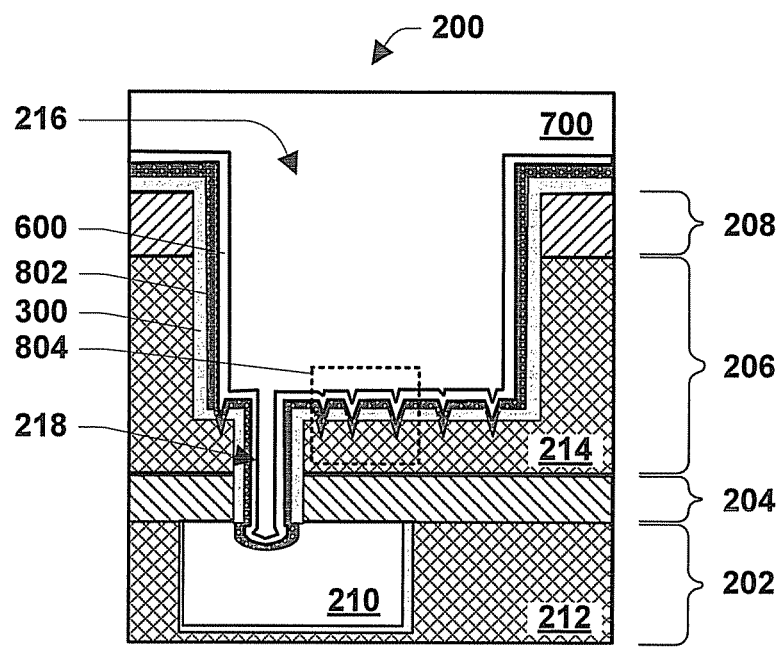
Figure 8B:
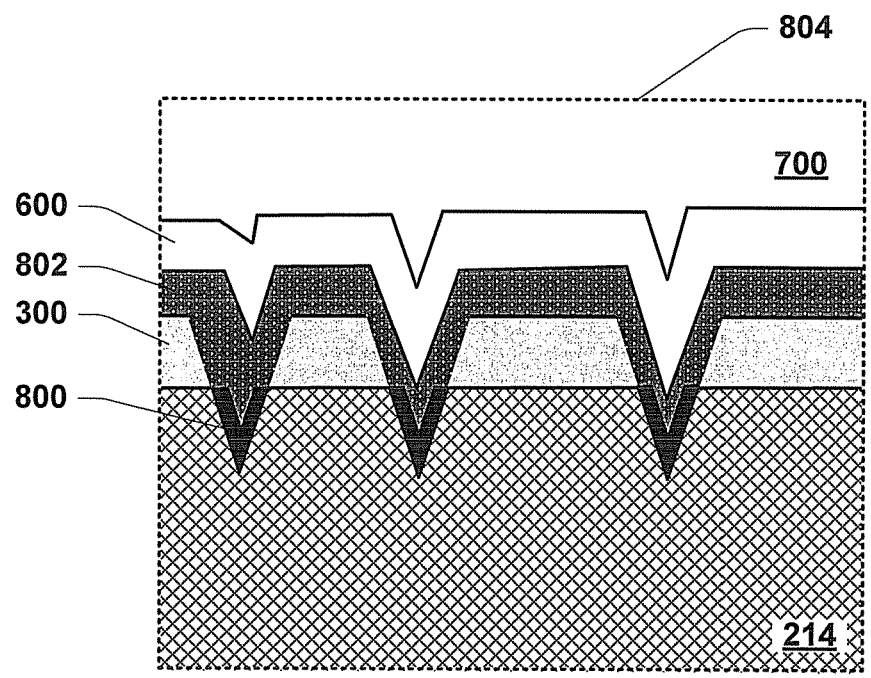

FIGS. 8a and 8b illustrate annealing the Mn-containing barrier layer 500 to form manganese oxides ($MnO_x$, where x is 1 to 2, such as MnO, $MnO_2$, $Mn_2O_3$, and $Mn_3O_4$) 800 in the Mn-containing barrier layer, thereby forming a $MnO_x$-containing barrier layer 802. A portion of the $MnO_x$-containing barrier layer indicated by a dashed line 804 is exploded in FIG. 8b.

The manganese oxide is formed by oxidizing manganese in the Mn-containing barrier layer with oxygen from the second dielectric layer 214. Since the oxygen is provided from the second dielectric layer, the manganese oxide can be formed at the discontinuities of the first barrier layer of the second interconnect layer. In other words, the manganese oxide can be formed where the Mn-containing barrier layer contacts the second dielectric layer. Containing manganese oxides, the Mn-containing barrier layer can provide a high barrier property and prevent and/or mitigate diffusion of conductive material of the second conductive feature therethrough.

The manganese oxides 800 can be formed by any suitable annealing condition as long as the resultant manganese oxide can prevent and/or mitigate the diffusion of conductive material of the second conductive feature therethrough. In one embodiment, the manganese oxide is formed at temperatures of about 50 degrees Celsius or more and about 500 degrees Celsius or less and for about 10 minutes or more and about 300 minutes or less. In another embodiment, the manganese oxide is formed at temperatures of about 70 degrees Celsius or more and about 450 degrees Celsius or less and for about 20 minutes or more and about 200 minutes or less. In yet another embodiment, the manganese oxide is formed at temperatures of about 100 degrees Celsius or more and about 400 degrees Celsius or less and for about 30 minutes or more and about 120 minutes or less. The manganese oxide can be formed in a $N_2$ atmosphere or $N_2/H_2$ atmosphere.

Figure 9:
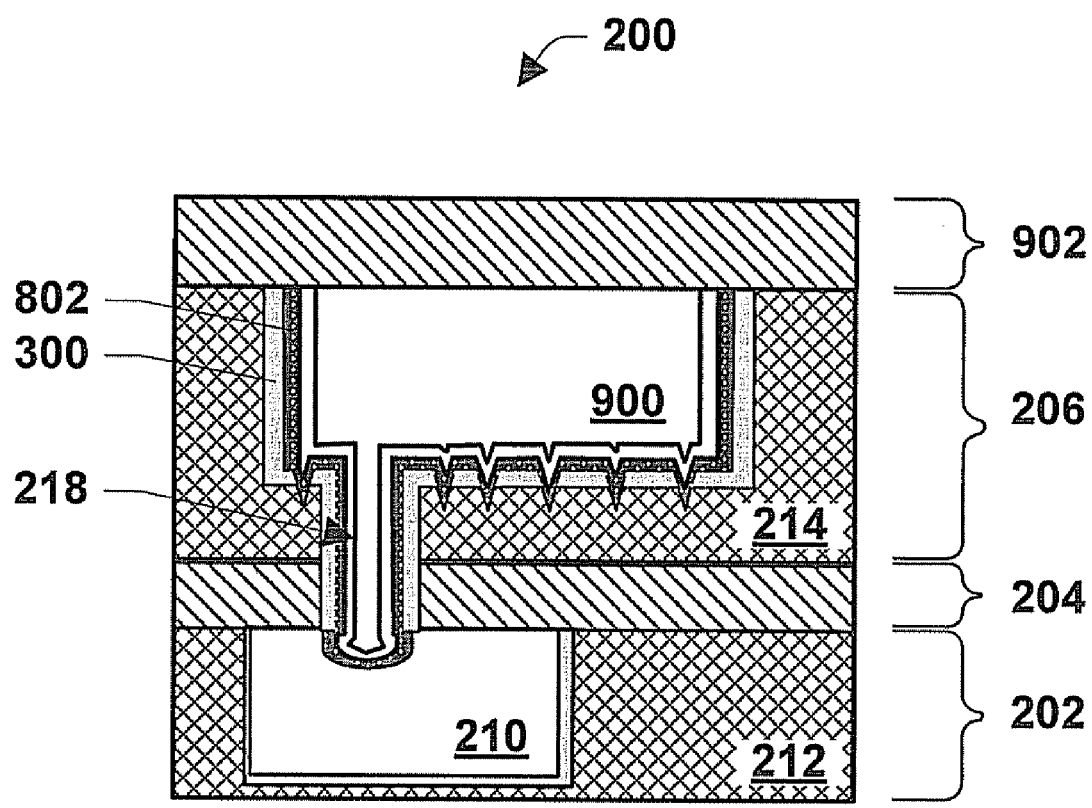

FIG. 9 illustrates removing an upper portion of the second conductive material 700 and the third dielectric layer 208, thereby forming a second conductive feature 900, and forming a second cap layer 902 over the second interconnect layer. The upper portion of the second conductive material and the third dielectric layer can be removed, for example, by chemical-mechanical polishing (CMP). The second cap layer can be formed in the same manner for forming the first cap layer as described in connection with FIG. 2.

Figure 10:
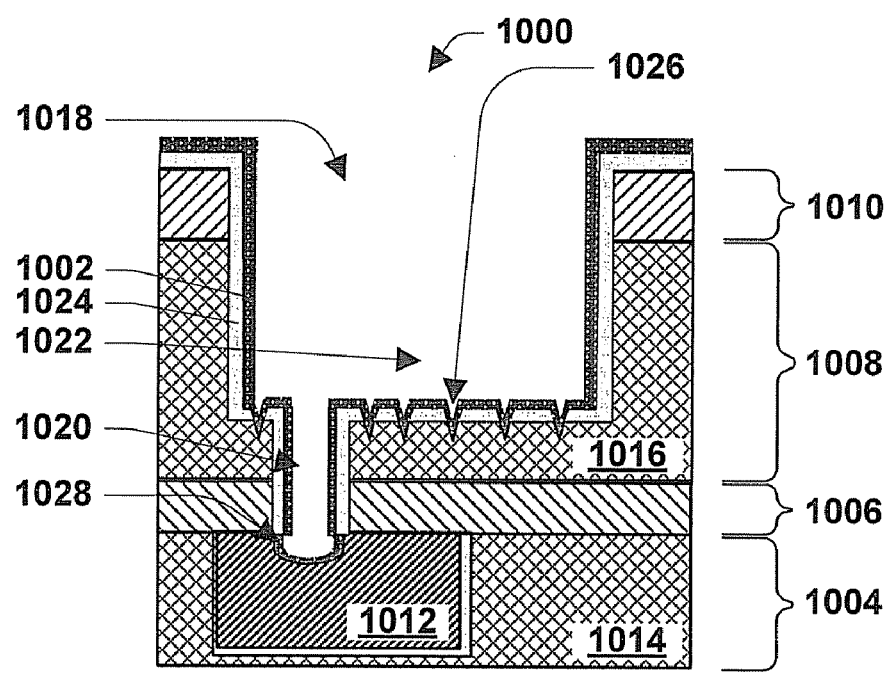
FIGS. 10-12 illustrate another exemplary methodology of forming a back end of line interconnect structure in accordance with an aspect of the subject innovation.
Figure 11:
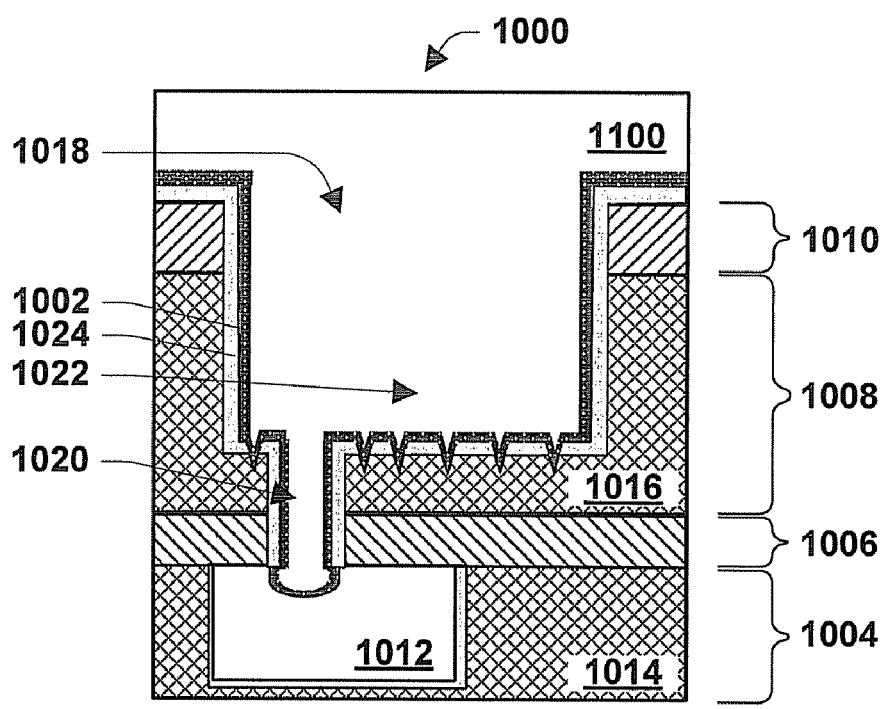
Figure 12:
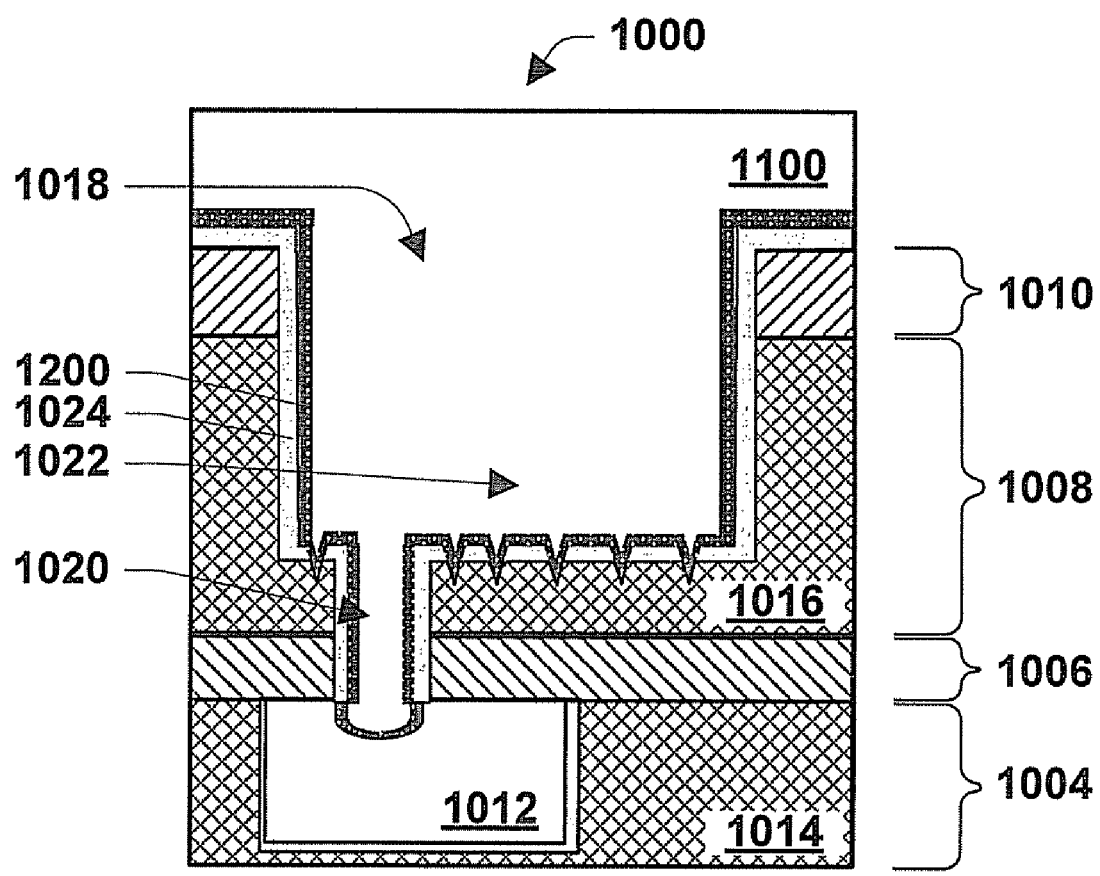

FIGS. 10-12 illustrate another exemplary method of making a back end of line interconnect structure. FIG. 10 illustrates a cross sectional view of an intermediate state of a portion of an exemplary back end of line interconnect structure 1000. The back end of line interconnect structure 1000 can contain the same features as the back end of line interconnect structure as described in connection with FIG. 5 except that a Mn-containing barrier layer 1002 further contains at least one seed metal (e.g., copper).

The back end of line interconnect structure 1000 can contain a first interconnect layer 1004, a first cap layer 1006 over the first interconnect layer, and a second interconnect layer 1008 over the first cap layer. The intermediate state of back end of line interconnect structure can contain a third dielectric layer 1010 over the second interconnect layer.

The first interconnect layer 1004 contains a first conductive feature 1012 and a first dielectric layer 1014 in the same manner as described in connection with FIG. 5. The first cap layer contains any suitable dielectric capping material. The second interconnect layer contains a second dielectric layer 1016. The second dielectric layer contains any dielectric material of the first dielectric layer as described above in connection with FIG. 5. The second dielectric layer contains an opening 1018 containing a via 1020 and a trench 1022. The third dielectric layer can contain any suitable dielectric material such as silicon oxides.

The back end of line interconnect structure 1000 contains a first barrier layer 1024 in the second interconnect layer over the sidewalls and bottom surface of the opening. The first barrier layer has damages (e.g., rough surface and discontinuities 1026) due to an etchback process to remove a portion 1028 of the first barrier layer at the bottom of the via.

The Mn-containing barrier layer 1002 contains a Mn alloy that contains manganese and at least one seed metal. The seed metal can facilitate forming a second conductive feature as a seed in the subsequent electrical plating process. The seed metal can be any suitable metal as long as the metal can facilitate forming a second conductive feature.

The Mn alloy can be a Z—Mn alloy wherein Z is at least one selected from the group consisting of copper (Cu), aluminum (Al), tantalum (Ta), titanium (Ti), and cobalt (Co). Examples of Z—Mn alloys include CuMn, AlMn, TaMn, TiMn, CoMn, CuTaMn, CuTiMn, CuAlMn, CuCoMn, TaTiMn, TaAlMn, TaCoMn, TiAlMn, TiCoMn, AlCoMn, or the like. When the subsequently formed second conductive feature contains copper, the Mn alloy contains copper as a seed metal.

The Mn-containing barrier layer 1002 can contain any suitable amount of manganese. In one embodiment, the Mn-containing barrier layer contains about 0.5 wt. % or more of manganese and about 99.5 wt. % or less of manganese. In another embodiment, the Mn-containing barrier layer contains about 1 wt. % or more of manganese and about 90 wt. % or less of manganese. In yet another embodiment, the Mn-containing barrier layer contains about 1 wt. % or more of manganese and about 80 wt. % or less of manganese.

The Mn-containing barrier layer 1002 can contain any suitable amount of seed metal. In one embodiment, the Mn-containing barrier layer contains about 0.5 wt. % or more of seed metal and about 99.5 wt. % or less of seed metal. In another embodiment, the Mn-containing barrier layer contains about 10 wt. % or more of seed metal and about 99 wt. % or less of seed metal. In yet another embodiment, the Mn-containing barrier layer contains about 20 wt. % or more of seed metal and about 99 wt. % or less of seed metal.

The Mn-containing barrier layer 1002 can be formed by any suitable technique. For example, the Mn-containing barrier layer is formed by PVD, IPVD, SIP, ALD, SCCO$_2$, CVD, MOCVD, PECVD, PEALD, or the like.

Although not shown in FIG. 10, before forming the Mn-containing barrier layer, a second barrier layer can be formed over the damaged first barrier layer. The second barrier layer can have any suitable barrier material of the first barrier layer as described above in connection with FIG. 5. For example, the second barrier layer contains tantalum (Ta), tantalum nitride (TaN), titanium (Ti), or titanium nitride (TiN).

The second barrier layer can be formed by any suitable technique. Examples of such techniques include PVD, IPVD, SIP, ALD, SCCO$_2$, CVD, MOCVD, PECVD, PEALD, or the like.

FIG. 11 illustrates forming a second conductive material 1100 in the opening 1018. A conductive material (e.g., copper (Cu), aluminum (Al) or alloy of copper (Cu) and aluminum (Al)) can be formed in the opening by electrical plating. The conductive material can contain any suitable additives such as aluminum (Al), cobalt (Co), manganese (Mn), tin (Sn), or the like. The thickness of second conductive material is about 300 nm or more and about 800 nm or less. Since the Mn-containing barrier layer contains a seed metal, the second conductive material can be formed by electrical plating without forming a seed layer.

FIG. 12 illustrates annealing the Mn-containing barrier layer 1002 to form manganese oxides (MnO$_x$, where x is 1 to 2, such as MnO, MnO$_2$, Mn$_2$O$_3$, and Mn$_3$O$_4$) in the Mn-containing barrier layer, thereby forming a MnO$_x$-containing barrier layer 1200. The manganese oxide is formed by oxidizing manganese in the Mn-containing barrier layer with oxygen from the second dielectric layer. The manganese oxide can be formed in the same manner as described in connection with FIGS. 8a and 8b.

Although not shown in FIG. 12, after forming the MnO$_x$-containing barrier layer 1200, an upper portion of the second conductive material and the third dielectric layer are removed, thereby forming a second conductive feature, and forming a second cap layer over the second interconnect layer.

Figure 13:
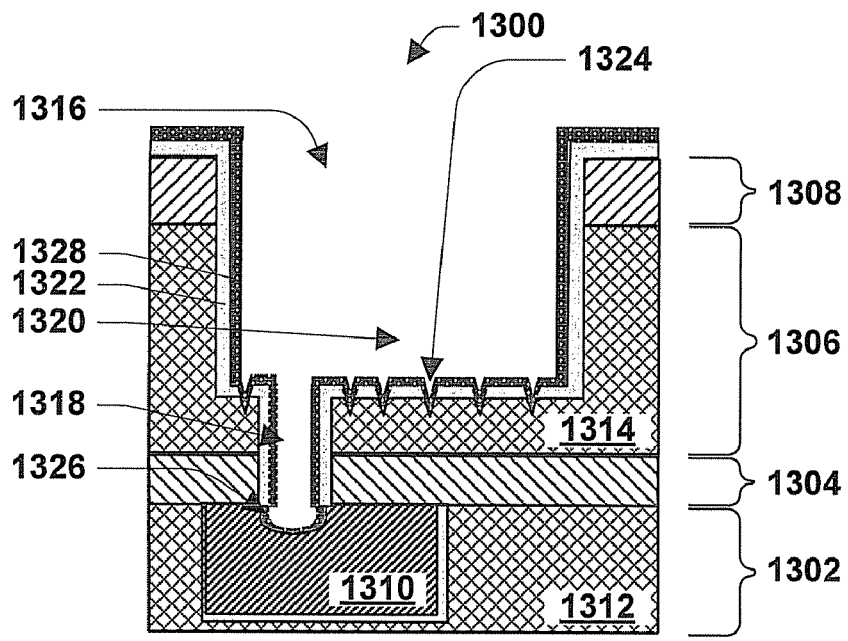
FIGS. 13-16 illustrate yet another exemplary methodology of forming a back end of line interconnect structure in accordance with an aspect of the subject innovation.

FIGS. 13-16 illustrate yet another exemplary method of making a back end of line interconnect structure. FIG. 13 illustrates a cross sectional view of an intermediate state of a portion of an exemplary back end of line interconnect structure 1300. The back end of line interconnect structure 1300 can contain the same features as the back end of line interconnect structure as described in connection with FIG. 10.

The back end of line interconnect structure 1300 can contain a first interconnect layer 1302, a first cap layer 1304 over the first interconnect layer, and a second interconnect layer 1306 over the first cap layer. The intermediate state of back end of line interconnect structure can contain a third dielectric layer 1308 over the second interconnect layer.

The first interconnect layer 1302 contains a first conductive feature 1310 and a first dielectric layer 1312 in the same manner as described in connection with FIG. 10. The first cap layer contains any suitable dielectric capping material. The second interconnect layer 1306 contains a second dielectric layer 1314. The second dielectric layer contains any dielectric material of the first dielectric layer as described above in connection with FIG. 10. The second dielectric layer contains an opening 1316 containing a via 1318 and a trench 1320. The third dielectric layer can contain any suitable dielectric material such as silicon oxides.

The back end of line interconnect structure 1300 contains a first barrier layer 1322 over the sidewalls and bottom surface of the opening. The first barrier layer has damages (e.g., rough surface and discontinuities) 1324 due to an etchback process to remove a portion 1326 of the first barrier layer at the bottom of the via.

The back end of line interconnect structure contains a Mn-containing barrier layer 1328 over the first barrier layer. The Mn-containing barrier layer contains a Mn alloy that contains manganese and at least one seed metal. The Mn-containing barrier layer can be the same as the Mn-containing layer as described in connection with FIG. 10.

Although not shown in FIG. 13, before forming the Mn-containing barrier layer, a second barrier layer can be formed over the damaged first barrier layer. The second barrier layer can have any suitable barrier material of the first barrier layer as described above in connection with FIG. 1. For example, the second barrier layer contains tantalum (Ta), tantalum nitride (TaN), titanium (Ti), or titanium nitride (TiN).

Figure 14:
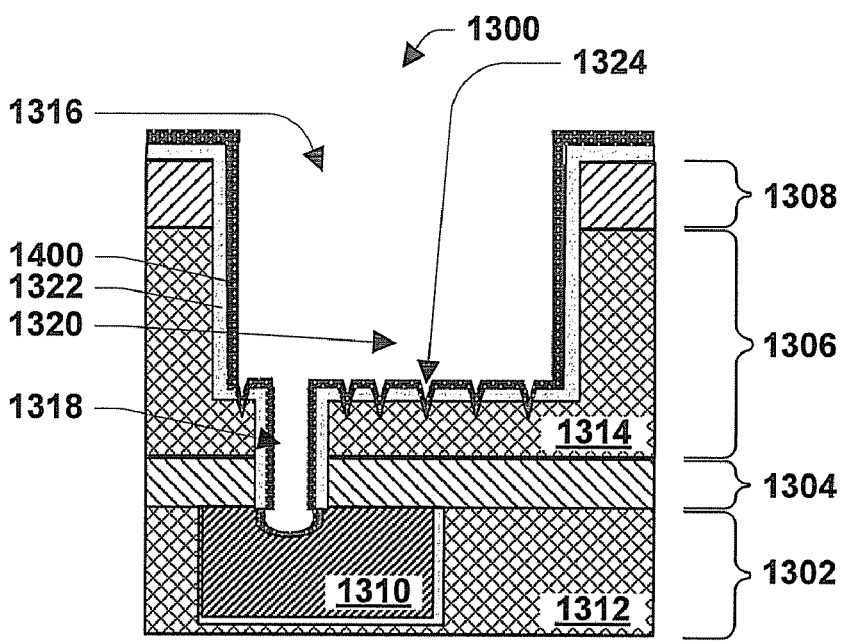

FIG. 14 illustrates annealing the Mn-containing barrier layer to form manganese oxides ($MnO_x$, where x is 1 to 2, such as MnO, $MnO_2$, $Mn_2O_3$, and $Mn_3O_4$) in the Mn-containing barrier layer, thereby forming a $MnO_x$-containing barrier layer 1400. The manganese oxide is formed by oxidizing manganese in the Mn-containing barrier layer with oxygen from the second dielectric layer 1314. The manganese oxide can be formed in the same manner as described in connection with FIGS. 8a and 8b.

Figure 15:
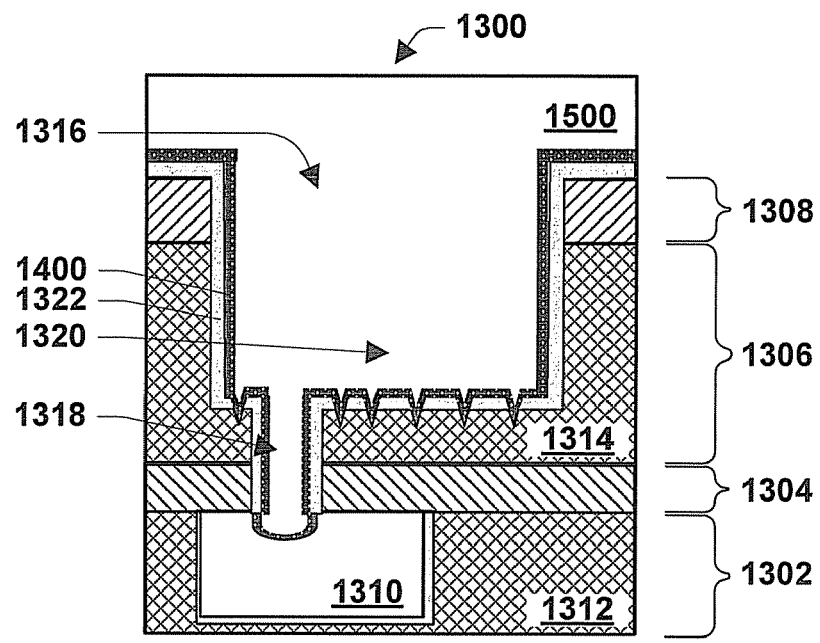

FIG. 15 illustrates forming a second conductive material 1500 in the opening 1316. A conductive material (e.g., copper (Cu), aluminum (Al), or an alloy of copper (Cu) and aluminum (Al)) can be formed in the opening by electrical plating. The conductive material can contain any suitable additives such as aluminum (Al), cobalt (Co), manganese (Mn), tin (Sn), or the like. The thickness of second conductive material is about 300 nm or more and about 800 nm or less. Since the Mn-containing barrier layer contains a seed metal, the second conductive material can be formed by electrical plating without forming a seed layer.

Figure 16:
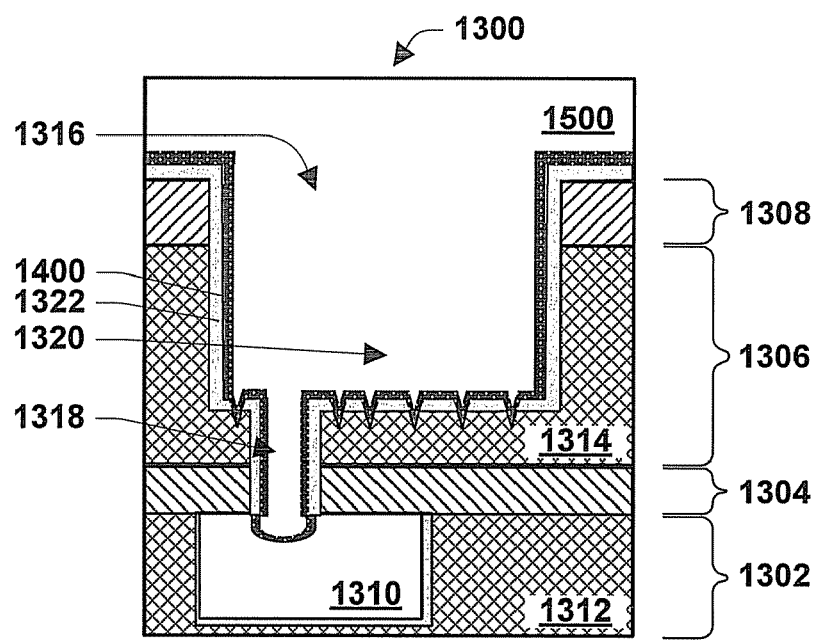

FIG. 16 illustrates annealing the $MnO_x$-containing barrier layer 1400 to ensure that manganese oxides are formed in the $MnO_x$-containing barrier layer. Manganese in the $MnO_x$-containing layer is oxidized by annealing in the same manner as described in FIG. 14. When enough manganese oxides to prevent and/or mitigate the diffusion are formed by the previous annealing as described in connection with FIG. 14, this annealing in FIG. 16 is not necessary, and the method does not involve this annealing.

Although not shown in FIG. 16, after forming the $MnO_x$-containing barrier layer, an upper portion of the second conductive material and the third dielectric layer are removed, thereby forming a second conductive feature. A second cap layer can be formed over the second interconnect layer.

Figure 17:
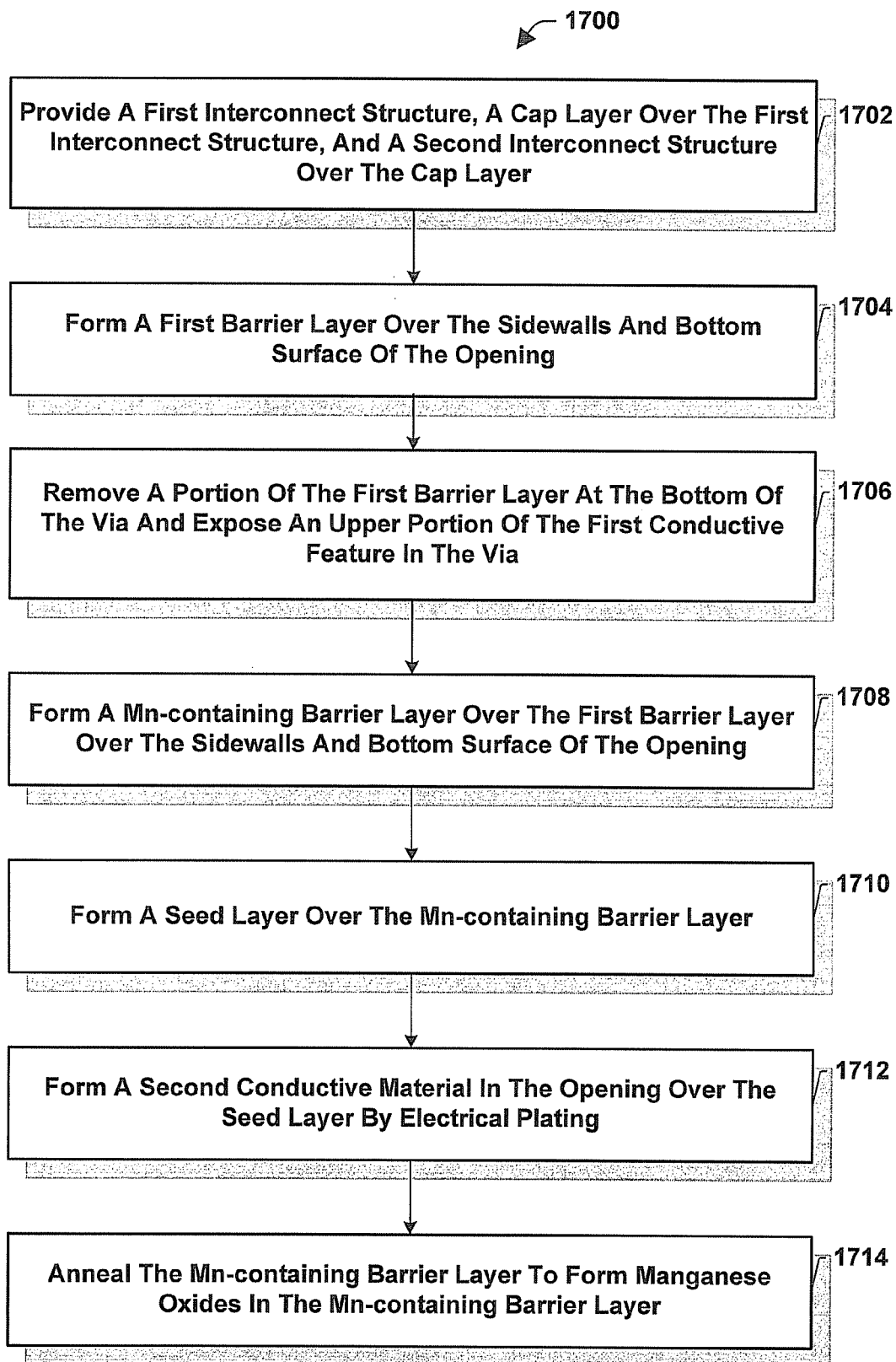
FIG. 17 is a flow diagram of an exemplary methodology of forming a back end of line interconnect structure in accordance with an aspect of the subject innovation.

FIG. 17 illustrates an exemplary methodology 1600 of making a back end of line interconnect structure. At 1702, a first interconnect layer, a first cap layer over the first interconnect layer, and a second interconnect layer over the first cap layer are provided. The first interconnect layer can contain a first conductive feature and a first dielectric layer. The second interconnect layer can contain a second dielectric layer and an opening including a via and a trench in the second dielectric layer. The via can extend through the first cap layer to the upper surface of the first conductive feature.

At 1704, a first barrier layer is formed over the sidewalls and bottom surface of the opening. At 1706, a portion of the first barrier layer at the bottom of the via is removed and an upper portion of the first conductive feature is exposed in the via. At 1708, a Mn-containing barrier layer is formed over the first barrier layer over the sidewalls and bottom surface of the opening. At 1710, a seed layer is formed over the Mn-containing barrier layer. At 1712, a second conductive material is formed in the opening over the seed layer by electrical plating. At 1714, the Mn-containing barrier layer is annealed to form manganese oxides in the Mn-containing barrier layer.

Although not shown in FIG. 17, the methodology can involve one or more of the following features. The Mn-containing barrier layer contains Mn or Y-Mn alloy wherein Y is at least one selected from the group consisting of tantalum (Ta), titanium (Ti), aluminum (Al), and cobalt (Co). The Mn-containing barrier layer contains about 1 wt. % or more of manganese and about 70 wt. % or less of manganese. The manganese oxides is formed by oxidizing manganese in the Mn-containing barrier layer with oxygen from the second dielectric layer.

In one embodiment, when removing a portion of the first barrier layer at the bottom of the via, discontinuities are formed in the first barrier layer, and the Mn-containing barrier layer is formed over the first barrier layer, thereby covering the discontinuities. The Mn-containing barrier layer is annealed to form manganese oxides in the Mn-containing barrier layer, thereby bringing the manganese oxide into contact with the second dielectric layer through the discontinuities of the first barrier layer.

Figure 18:
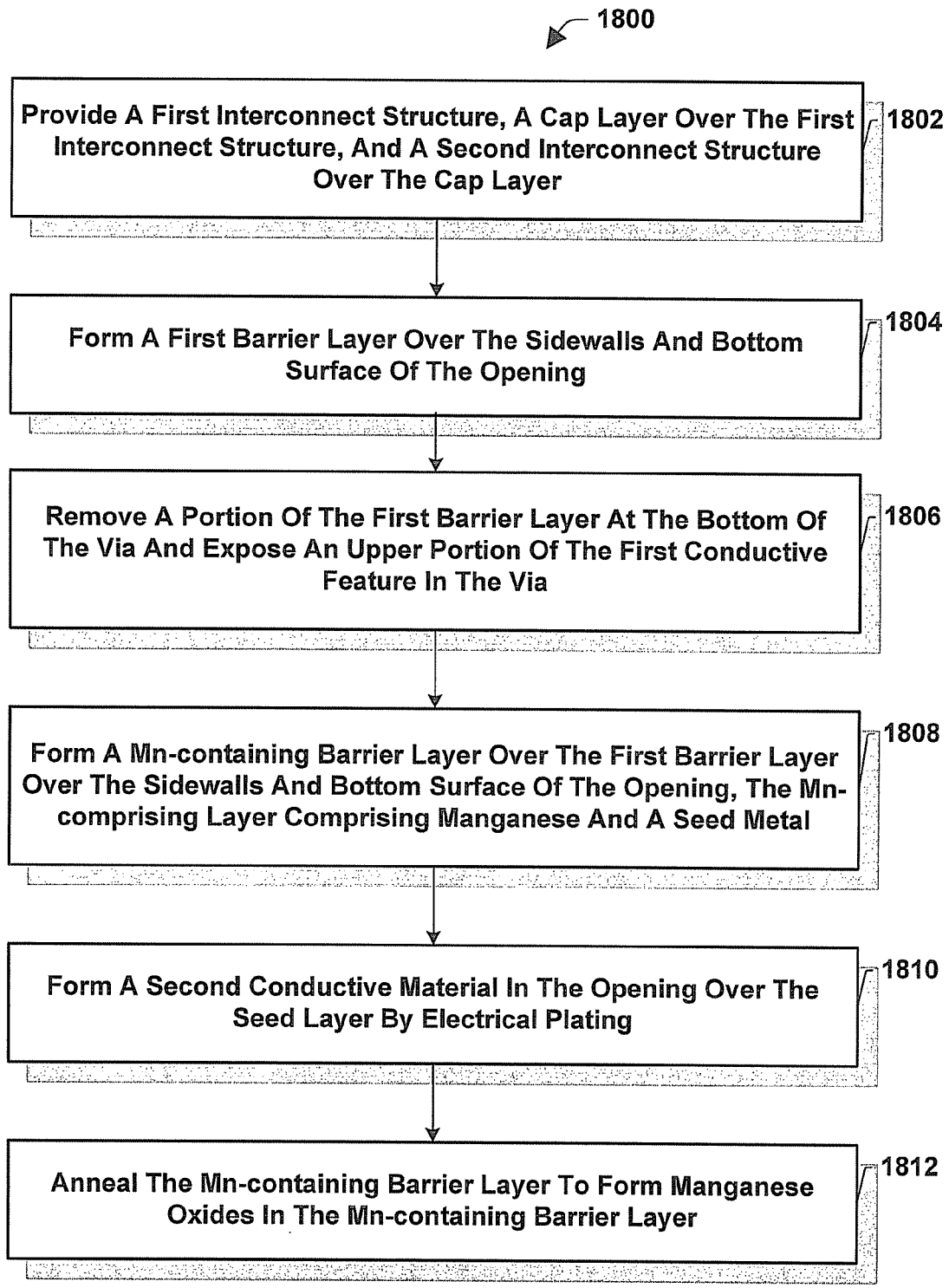
FIG. 18 is a flow diagram of another exemplary methodology of forming a back end of line interconnect structure in accordance with an aspect of the subject innovation.

FIG. 18 illustrates another exemplary methodology 1800 of making a back end of line interconnect structure. At 1802, a first interconnect layer, a first cap layer over the first interconnect layer, and a second interconnect layer over the first cap layer are provided. The first interconnect layer can contain a first conductive feature and a first dielectric layer. The second interconnect layer can contain a second dielectric layer and an opening including a via and a trench in the second dielectric layer. The via can extend through the first cap layer to the upper surface of the first conductive feature.

At 1804, a first barrier layer is formed over the sidewalls and bottom surface of the opening. At 1806, a portion of the first barrier layer at the bottom of the via is removed and an upper portion of the first conductive feature is exposed in the via. At 1808, a Mn-containing barrier layer is formed over the first barrier layer over the sidewalls and bottom surface of the opening, the Mn-containing layer containing manganese and at least one seed metal. At 1810, a second conductive material is formed in the opening over the Mn-containing barrier layer. At 1812, the Mn-containing barrier layer is annealed to form manganese oxides in the Mn-containing barrier layer.

Although not shown in FIG. 18, the methodology can involve one or more of the following features. The Mn-containing barrier layer contains a Z—Mn alloy wherein Z is at least one selected from the group consisting of copper (Cu), aluminum (Al), tantalum (Ta), titanium (Ti), and cobalt (Co). The Mn-containing barrier layer contains an alloy selected from the group consisting of CuMn, AlMn, TaMn, TiMn, CoMn, CuTaMn, CuTiMn, CuAlMn, CuCoMn, TaTiMn, TaAlMn, TaCoMn, TiAlMn, TiCoMn, and AlCoMn. The manganese oxides is formed by oxidizing manganese in the Mn-containing barrier layer with oxygen from the second dielectric layer.

In one embodiment, when removing a portion of the first barrier layer at the bottom of the via, discontinuities are formed in the first barrier layer, and the Mn-containing barrier layer is formed over the first barrier layer, thereby covering the discontinuities. The Mn-containing barrier layer is annealed to form manganese oxides in the Mn-containing barrier layer, thereby bringing the manganese oxide into contact with the second dielectric layer through the discontinuities of the first barrier layer.

The methodology can further involve, after forming the Mn-containing barrier layer and before forming the second conductive material, annealing the Mn-containing barrier layer to form manganese oxides in the Mn-containing barrier layer. The methodology can further involve, after removing the portion of the first barrier layer at the bottom of the via and forming the Mn-containing barrier layer, forming another barrier layer over the first barrier layer.

With respect to any figure or numerical range for a given characteristic, a figure or a parameter from one range may be combined with another figure or a parameter from a different range for the same characteristic to generate a numerical range.

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising " is interpreted when employed as a transitional word in a claim.

What is claimed is:

1. A back end of line interconnect structure, comprising:
   a first interconnect layer comprising a first conductive feature and a first dielectric layer;
   a first cap layer over the first interconnect layer; and
   a second interconnect layer over the first cap layer, the second interconnect layer comprising a second dielectric layer and an opening therein comprising a via and a trench, the opening comprising a second conductive feature and two or more barrier layers between the second conductive feature and the second dielectric layer, a portion of the second conductive feature extending through the first cap layer to the upper surface of the first conductive layer, the two or more barrier layers comprising a first barrier layer over the second dielectric layer in the opening and a $MnO_x$-comprising barrier layer over the first barrier layer.

2. The back end of line interconnect structure of claim 1, wherein the first barrier layer has discontinuities over the bottom surface of the trench and portions of the MnOx-comprising barrier layer contact the second dielectric layer through the discontinuities of the first barrier layer.

3. The back end of line interconnect structure of claim 1, wherein the first barrier layer comprises two or more barrier layers.

4. The back end of line interconnect structure of claim 1, wherein $MnO_x$-comprising barrier layer comprises about 1 wt. % or more of manganese oxides and about 70 wt. % or less of manganese oxides.

5. The back end of line interconnect structure of claim 1, wherein the manganese oxides is formed by oxidizing manganese with oxygen from the second dielectric layer.

6. The back end of line interconnect structure of claim 1, wherein the first and second conductive features comprise copper, the first and second dielectric layers comprise porous SiCOH, the first cap layer comprise at least one selected from the group consisting of silicon carbide (SiC), silicon nitride (SiN), and silicon carbon nitride (SiCN).

7. A method of making a back end of line interconnect structure, comprising:
   providing a first interconnect layer, a first cap layer over the first interconnect layer, and a second interconnect layer over the first cap layer, the first interconnect layer comprising a first conductive feature and a first dielectric layer, the second interconnect layer comprising a second dielectric layer and an opening comprising a via and a trench, the via extending through the first cap layer to the upper surface of the first conductive feature;
   forming a first barrier layer over the sidewalls and bottom surface of the opening; removing a portion of the first barrier layer at the bottom of the via and exposing an upper portion of the first conductive feature in the via;
   forming a Mn-comprising barrier layer over the first barrier layer over the sidewalls and bottom surface of the opening;
   forming a seed layer over the Mn-comprising barrier layer;
   forming a second conductive material in the opening over the seed layer by electrical plating; and
   annealing the Mn-comprising barrier layer to form manganese oxides in the Mn-comprising barrier layer.

8. A method of making a back end of line interconnect structure, comprising:
   providing a first interconnect layer, a first cap layer over the first interconnect layer, and a second interconnect layer over the first cap layer, the first interconnect layer comprising a first conductive feature and a first dielectric layer, the second interconnect layer comprising a second dielectric layer and an opening comprising a via and a trench, the via extending through the first cap layer to the upper surface of the first conductive feature;
   forming a first barrier layer over the sidewalls and bottom surface of the opening; removing a portion of the first barrier layer at the bottom of the via and exposing an upper portion of the first conductive feature in the via;
   forming a Mn-comprising barrier layer over the first barrier layer over the sidewalls and bottom surface of the opening, the Mn-comprising barrier layer comprising manganese and at least one seed metal;
   forming a second conductive material in the opening over the Mn-comprising barrier layer by electrical plating; and
   annealing the Mn-comprising barrier layer to form manganese oxides in the Mn-comprising barrier layer.

9. The back end of line interconnect structure of claim 2, wherein the first barrier layer comprises at least one from the group consisting of tantalum, tantalum nitride, titanium, or titanium nitride.

10. The back end of line interconnect structure of claim 2, wherein $MnO_x$-comprising barrier layer comprises about 1 wt. % or more of manganese oxides and about 70 wt. % or less of manganese oxides, and the manganese oxides are formed by oxidizing manganese with oxygen from the second dielectric layer.

11. The back end of line interconnect structure of claim 1, wherein the first barrier layer has discontinuities over the bottom surface of the trench.

12. The back end of line interconnect structure of claim 11, wherein $MnO_x$-comprising barrier layer covers the discontinuities of the first barrier layer.

13. The back end of line interconnect structure of claim 11, wherein a portion of the second dielectric layer in the opening on which the discontinuities of the first barrier layer are formed do not contact the second conductive feature.

14. The back end of line interconnect structure of claim 11, wherein $MnO_x$-comprising barrier layer comprises about 1 wt. % or more of manganese oxides and about 70 wt. % or less of manganese oxides.

15. The back end of line interconnect structure of claim 11, wherein the manganese oxides are formed by oxidizing manganese with oxygen from the second dielectric layer.

16. The back end of line interconnect structure of claim 11, wherein the first and second conductive features comprise copper, the first and second dielectric layers comprise porous SiCOH, the first cap layer comprise at least one selected from the group consisting of silicon carbide (SiC), silicon nitride (SiN), and silicon carbon nitride (SiCN).

17. The back end of line interconnect structure of claim 1, wherein portions of the $MnO_x$-comprising barrier layer contact the second dielectric layer in the bottom surface of the trench.

18. The method of claim 7, wherein the Mn-comprising barrier layer comprises Mn or Y-Mn alloy wherein Y is at least one selected from the group consisting of tantalum (Ta), titanium (Ti), aluminum (Al), and cobalt (Co).

19. The method of claim 7, wherein the Mn-comprising barrier layer comprises about 1 wt. % or more of manganese and about 70 wt. % or less of manganese.

20. The method of claim 7, wherein when removing a portion of the first barrier layer at the bottom of the via, discontinuities are formed in the first barrier layer, and the Mn-comprising barrier layer is formed over the first barrier layer, thereby covering the discontinuities.

21. The method of claim 20, wherein the Mn-comprising barrier layer is annealed to form manganese oxides in the Mn-comprising barrier layer, thereby bringing the manganese oxide into contact with the second dielectric layer through the discontinuities of the first barrier layer.

22. The method of claim 7, wherein the manganese oxides is formed by oxidizing manganese in the Mn-comprising barrier layer with oxygen from the second dielectric layer.

23. The method of claim 8 further comprising, after forming the Mn-comprising barrier layer and before forming the second conductive material, annealing the Mn-comprising barrier layer to form manganese oxides in the Mn-comprising barrier layer.

24. The method of claim 8 further comprising, after removing the portion of the first barrier layer at the bottom of the via and forming the Mn-comprising barrier layer, forming another barrier layer over the first barrier layer.

25. The method of claim 8, wherein the Mn-comprising barrier layer comprises a Z-Mn alloy wherein Z is at least one selected from the group consisting of copper (Cu), aluminum (Al), tantalum (Ta), titanium (Ti), and cobalt (Co).

26. The method of claim 13, wherein the Mn-comprising barrier layer comprises an alloy selected from the group consisting of CuMn, AlMn, TaMn, TiMn, CoMn, CuTaMn, CuTiMn, CuAlMn, CuCoMn, TaTiMn, TaAlMn, TaCoMn, TiAlMn, TiCoMn, and AlCoMn.

27. The method of claim 8, wherein when removing a portion of the first barrier layer at the bottom of the via, discontinuities are formed in the first barrier layer, and the Mn-comprising barrier layer is formed over the first barrier layer, thereby covering the discontinuities.

28. The method of claim 27, wherein the Mn-comprising barrier layer is annealed to form manganese oxides in the Mn-comprising barrier layer, thereby bringing the manganese oxide into contact with the second dielectric layer through the discontinuities of the first barrier layer.

29. The method of claim 8, wherein the manganese oxides is formed by oxidizing manganese in the Mn-comprising barrier layer with oxygen from the second dielectric layer.

* * * * *